(12) United States Patent
Yang et al.

(10) Patent No.: US 10,701,819 B1
(45) Date of Patent: Jun. 30, 2020

(54) HOUSING STRUCTURE OF INFORMATION DISPLAY UNIT (71) Applicant: LITEMAX ELECTRONICS INC., New Taipei (TW)

(72) Inventors: Tien-Teng Yang, New Taipei (TW); Ling-Chi Lo, New Taipei (TW); Chun-Hung Chen, New Taipei (TW)

(73) Assignee: LITEMAX ELECTRONICS INC., New Taipei (TW)

( * ) Notice: Subject to any disclaimer, the term of this patent is extended or adjusted under 35 U.S.C. 154(b) by 0 days.

(21) Appl. No.: 16/679,388

(22) Filed: Nov. 11, 2019

(51) Int. Cl.
*H05K 5/00* (2006.01)
*G12B 9/08* (2006.01)
*H05K 5/02* (2006.01)
*G06F 1/18* (2006.01)

(52) U.S. Cl.
CPC ........... *H05K 5/0017* (2013.01); *G06F 1/183* (2013.01); *G12B 9/08* (2013.01); *H05K 5/0004* (2013.01); *H05K 5/0217* (2013.01); *H05K 5/0247* (2013.01)

(58) Field of Classification Search
CPC combination set(s) only.
See application file for complete search history.

(56) References Cited

U.S. PATENT DOCUMENTS

| 10,194,564 | B2 * | 1/2019 | Dunn | G02F 1/133308 |
|---|---|---|---|---|
| 10,485,113 | B2 * | 11/2019 | Dunn | H05K 5/03 |
| 10,499,516 | B2 * | 12/2019 | Dunn | G09F 9/35 |
| 10,559,965 | B2 * | 2/2020 | Dunn | H05K 5/0086 |
| 10,624,218 | B2 * | 4/2020 | Dunn | H05K 5/0226 |
| 2008/0236005 | A1 * | 10/2008 | Isayev | G09F 13/04 40/574 |
| 2019/0133002 | A1 * | 5/2019 | Dunn | H05K 7/20972 |
| 2019/0239365 | A1 * | 8/2019 | Dunn | H05K 7/1488 |

* cited by examiner

*Primary Examiner* — Lisa Lea-Edmonds
(74) *Attorney, Agent, or Firm* — Schmeiser, Olsen & Watts, LLP (57) ABSTRACT

A housing structure of an information display unit includes a casing, two extensible elements and a brace. The casing has therein a receiving space. A window is disposed on a front side of the casing and is in communication with the receiving space. The top ends and bottom ends of the extensible elements are pivotally disposed at the top end of the brace and the bottom of the casing such that the brace is liftably disposed on the front side of the casing. A screen is connectedly disposed on the brace. A circuit module electrically connected to the screen is disposed in the receiving space. To repair the circuit module in the casing or the screen on the brace, a technician merely lifts the brace such that the extensible elements turn forward and then extend upward so as to support the screen, rendering the repair convenient and quick.

10 Claims, 10 Drawing Sheets

HOUSING STRUCTURE OF INFORMATION DISPLAY UNIT

BACKGROUND OF THE INVENTION

1. Field of the Invention

The present disclosure relates to housing structures, and in particular to a housing structure of an information display unit.

2. Description of the Related Art

People traveling with public transport are on the rise for some reasons, for example, rapid development of public transport, namely Mass Rapid Transit, (MRT), trains and buses, lower fares of public transport relative to gasoline prices paid by drivers and motorcyclist, and the appeal of public transport in terms of ease of use and comfortableness.

To advertise effectively, including advertising various transport services and advertising commercial products which advertising clients offer, public transport providers place information display units in the cars and platforms. The information display units display various multimedia information and thereby provide travelers with the latest information pertaining to services and goods. To maximum its efficacy, the information display units display the multimedia information continuously, albeit in such a manner as to increase the chance that the information display units will fail. In view of this, maintenance services provided regularly to the information display units by maintenance technicians are required.

A conventional information display unit comprises a casing and a screen. The casing is integrally formed. The screen is mounted on the front side of the casing. To repair the conventional information display unit, a maintenance technician has to demount the information display unit to the detriment of convenience and time-efficiency. If the screen breaks down, the information display unit must be discarded in its entirety, incurring high repair costs and causing a waste of resources.

BRIEF SUMMARY OF THE INVENTION

To overcome the aforesaid drawbacks of the prior art, the present disclosure provides a housing structure of an information display unit. The housing structure comprises braces to render a repair process quick and efficient.

To achieve at least the above objective, the present disclosure provides a housing structure of an information display unit, comprising:
- a first casing having therein a first receiving space, wherein a first window is disposed on a front side of the first casing and is in communication with the first receiving space;
- two first extensible elements each having a bottom end pivotally disposed at a bottom of the front side of the first casing; and
- a first brace disposed on the front side of the first casing, wherein a top end of each said first extensible element is pivotally disposed at a top of the first brace such that the first brace is liftably disposed on the front side of the first casing.

Therefore, the first extensible elements are extensibly, pivotally disposed between the first casing and the first brace such that the first brace is liftably disposed on the front side of the first casing and can be lifted from the front relative to the first casing. A circuit module with a circuit structure is disposed in the first receiving space in the casing. A screen is fixedly connected to the first brace. The screen is electrically connected to the circuit module. According to the present disclosure, the housing structure holds the screen and the circuit module corresponding in position to the screen. To repair the screen or the circuit module, a maintenance technician only needs to lift the first brace such that the first extensible elements turn forward and then extend upward so as to push and support the first brace, so as to form a repair space between the first brace and the first casing to allow the maintenance technician to carry out a repair to the circuit module or the screen conveniently. In case of a failure of the screen, the maintenance technician only needs to demount the screen from the first brace; the maintenance technician neither needs to demount the housing structure entirely in order to repair the first screen nor needs to discard the housing structure entirely, so as to render the repair convenient and quick but also avoid a waste of material and thus reduce the repair costs.

The first brace enables the screen to be mounted in place so as to not only allow the maintenance technician to easily change a screen of different sizes as needed but also require the maintenance technician merely to electrically connect the screen to the circuit module in the first casing. Therefore, the present disclosure manifests ease of assembly and enhances the adaptability of choice of screen size.

The first casing has therein the first receiving space and is equipped with the liftable first brace. A screen of any size is adaptably mounted on the first brace to attain modularized islanding design, thereby enhancing demand.

DETAILED DESCRIPTION OF THE INVENTION

To facilitate understanding of the object, characteristics and effects of this present disclosure, embodiments together with the attached drawings for the detailed description of the present disclosure are provided.

Figure 1:
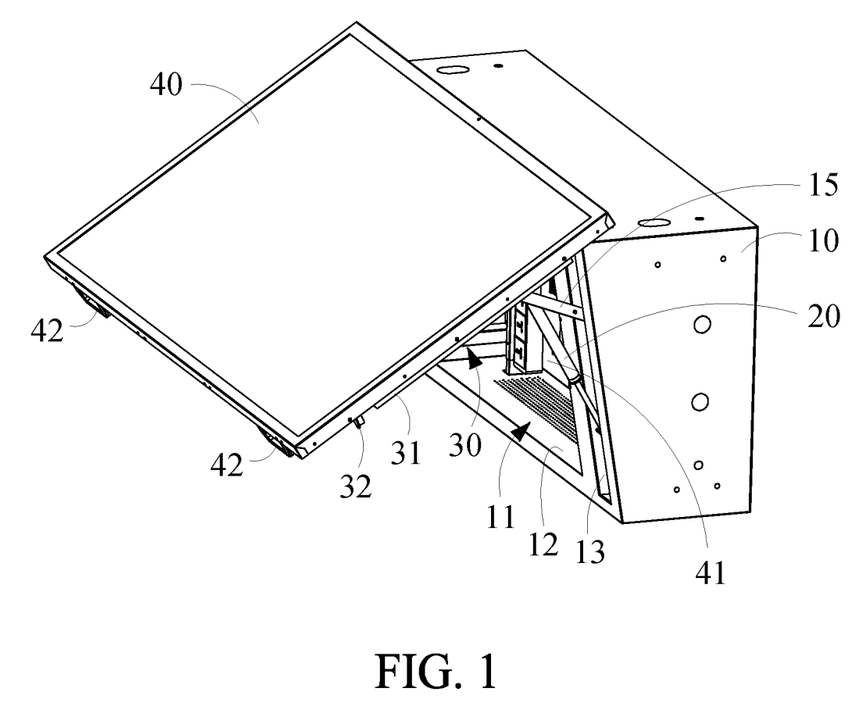
FIG. 1 is a first perspective view of the first preferred embodiment of the present disclosure.
Figure 2:
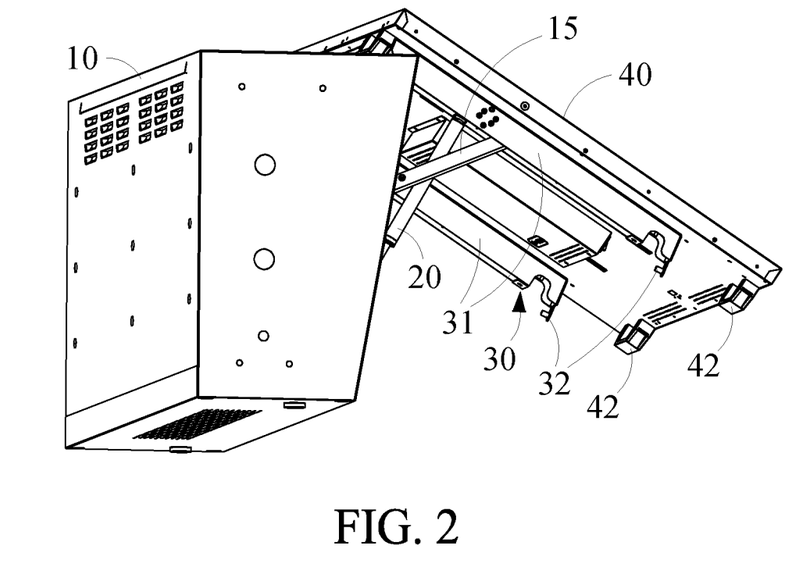
FIG. 2 is a second perspective view of the first preferred embodiment of the present disclosure.

Referring to FIGS. 1, 2, housing structure of an information display unit according to the first preferred embodiment of the present disclosure comprises a first casing 10, two first extensible elements 20 and a first brace 30. The first extensible elements 20 are extensibly, pivotally disposed between the first casing 10 and the first brace 30 such that the first brace 30 is liftably disposed on the first casing 10. When the first brace 30 is lifted, a repair space is formed between the first casing 10 and the first brace 30. In this embodiment, the first brace 30 is connected to a first screen 40. The first casing 10 has therein a circuit module 41 for electrically connecting to the first screen 40. In this embodiment, the first screen 40 has at least one handle portion 42 which a maintenance technician exerts a force on, so as to lift the first screen 40 and the first brace 30.

Figure 3:
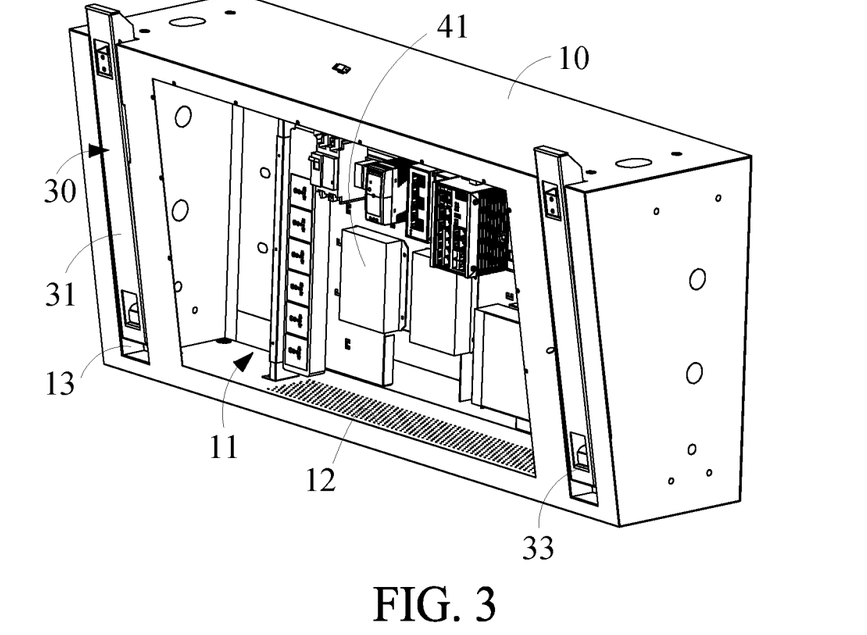
FIG. 3 is a third perspective view of the first preferred embodiment of the present disclosure.
Figure 4:
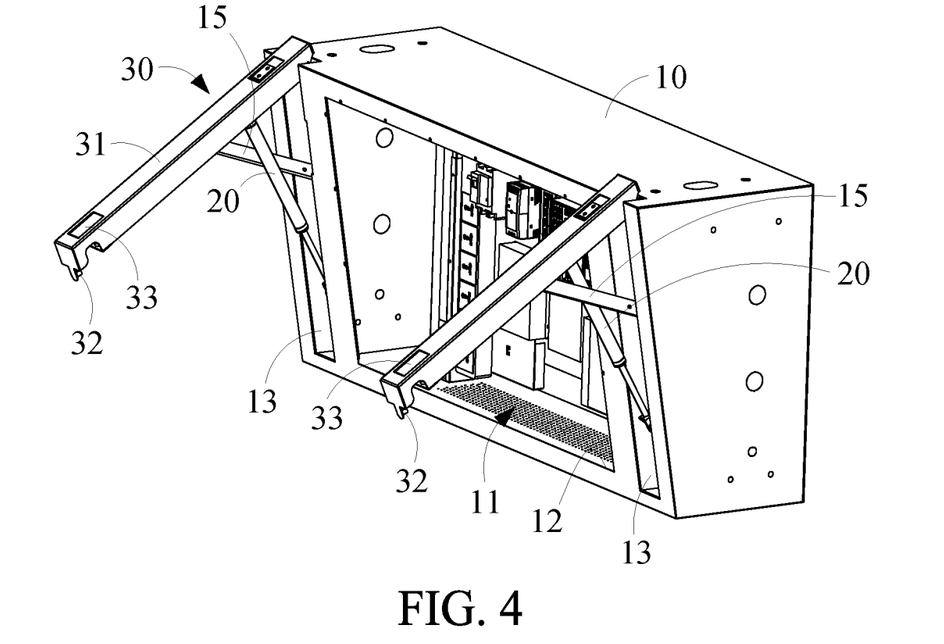
FIG. 4 is a fourth perspective view of the first preferred embodiment of the present disclosure.

The structures of the first casing 10, the first brace 30 and the first extensible elements 20 and the relationship therebetween are described below. Referring to FIGS. 3, 4, the first casing 10 has a front side, a back side opposing the front side, a left side, and a right side opposing the left side. The first casing 10 has therein a first receiving space 11 for receiving the circuit module 41. A first window 12 is disposed on the front side of the first casing 10 and is in communication with the first receiving space 11. A first channel 13 is disposed on the front side of the first casing 10 and positioned proximate to the left side of the first casing 10. Another first channel 13 is disposed on the front side of the first casing 10 and positioned proximate to the right side of the first casing 10. The first channels 13 receive the first brace 30 and the first extensible elements 20. In this embodiment, the first casing 10 is of an inverted trapezoid shape to not only render the first screen 40 readily visible to persons other than the maintenance technician but also provide sufficient space for the maintenance technician to examine the inside of the first casing 10. An inclination angle is defined between the front side and bottom side of the first casing 10. The inclination angle is preferably 10 degrees, but the present disclosure is not limited thereto.

The first extensible elements 20 each have a top end and a bottom end opposing the top end. The bottom ends of the first extensible elements 20 are pivotally disposed in the first channels 13, respectively, and positioned proximate to the bottom of the first casing 10, allowing the first channels 13 to receive the first extensible elements 20. In this embodiment, the first extensible elements 20 comprises a pneumatic cylinder, a hydraulic rod, and a pneumatic rod.

Figure 5:
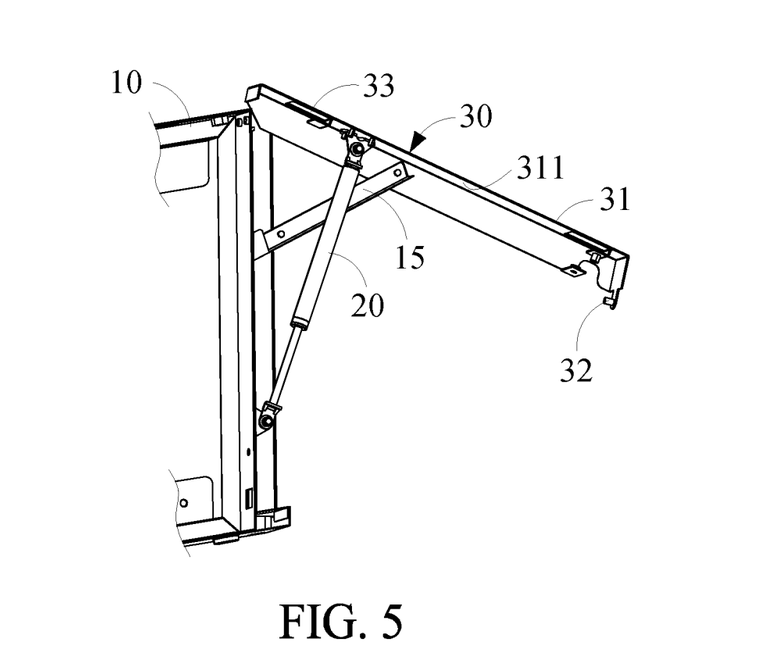
FIG. 5 is a first partial cross-sectional enlarged view of the first preferred embodiment of the present disclosure.

Referring to FIGS. 4, 5, the first casing 10 further comprises two auxiliary fixing elements 15. The two auxiliary fixing elements 15 are disposed on the left side and right side of the first casing 10, respectively. The two auxiliary fixing elements 15 each have a top end and a bottom end opposing the top end. The top ends of the two auxiliary fixing elements 15 are pivotally disposed on the first brace 30. The bottom ends of the two auxiliary fixing elements 15 are pivotally disposed in the first channels 13, respectively. The two auxiliary fixing elements 15 provide support to the first extensible elements 20 and reduce wear and tear of the first extensible elements 20.

Figure 6:
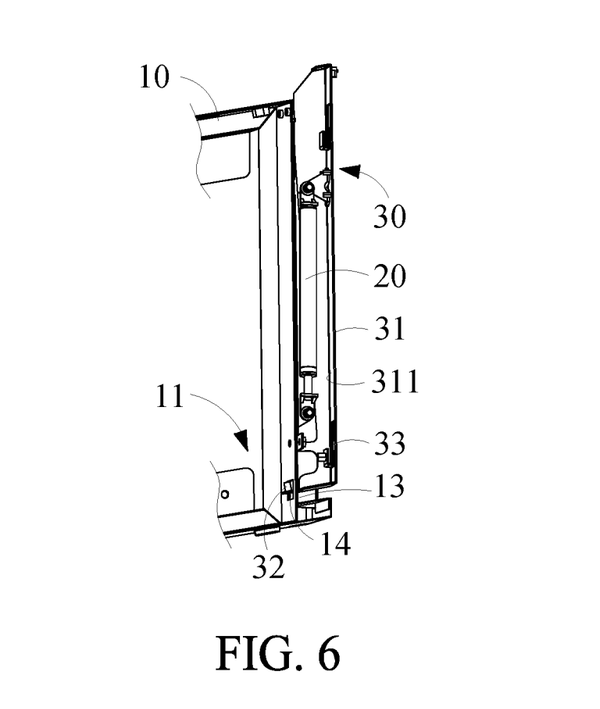
FIG. 6 is a second partial cross-sectional enlarged view of the first preferred embodiment of the present disclosure.

Referring to FIGS. 4, 5, the first brace 30 is pivotally connected to the first extensible elements 20 such that the first brace 30 is liftably disposed on the front side of the first casing 10. The first brace 30 comprises two support elements 31. A recess 311 is disposed on the back side of each of the support elements 31. The top ends of the first extensible elements 20 are pivotally disposed in the recesses 311 of the support elements 31, respectively, and positioned proximate to the top ends of the support elements 31, respectively. Likewise, the top ends of the two auxiliary fixing elements 15 are pivotally disposed in the recesses 311 of the support elements 31, respectively. Referring to FIG. 6, shutting the first brace 30 entails receiving the first extensible elements 20 in the recesses 311 of the support elements 31 and then receiving the first extensible elements 20 and the support elements 31 in the first channels 13 of the first casing 10.

The present disclosure aims to prevent separation of the first brace 30 from the first casing 10 (the separation might otherwise cause the first brace 30 to shake and thus lead to a breakdown of the first screen 40.) Referring to FIGS. 5, 6, in this embodiment, a first coupling portion 32 is disposed at the bottom end of each of the support elements 31, and a second coupling portion 14 is disposed in each first channel 13 of the first casing 10. With the first coupling portions 32 being coupled to the second coupling portions 14, the first brace 30 is unlikely to separate from the first casing 10. The first coupling portion 32 are each a hook portion, and the second coupling portions 14 are each a hole, allowing the hook portions to be caught in the holes, respectively.

In this embodiment, to augment the strength and stability of the connection of the first brace 30 and the first screen 40, at least one connecting portion 33 is disposed on each of the support elements 31 and adapted to connect to the first screen 40.

Figure 7:
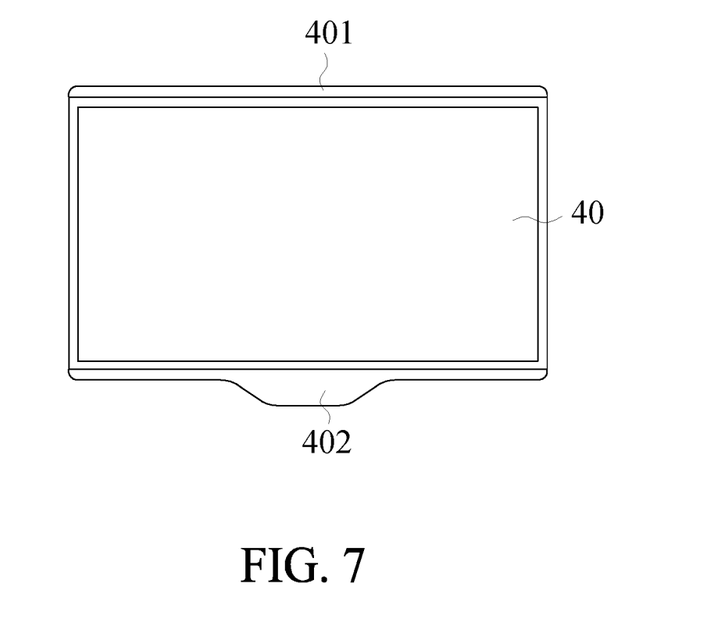
FIG. 7 is a front view of a first screen according to the first preferred embodiment of the present disclosure.
Figure 8:
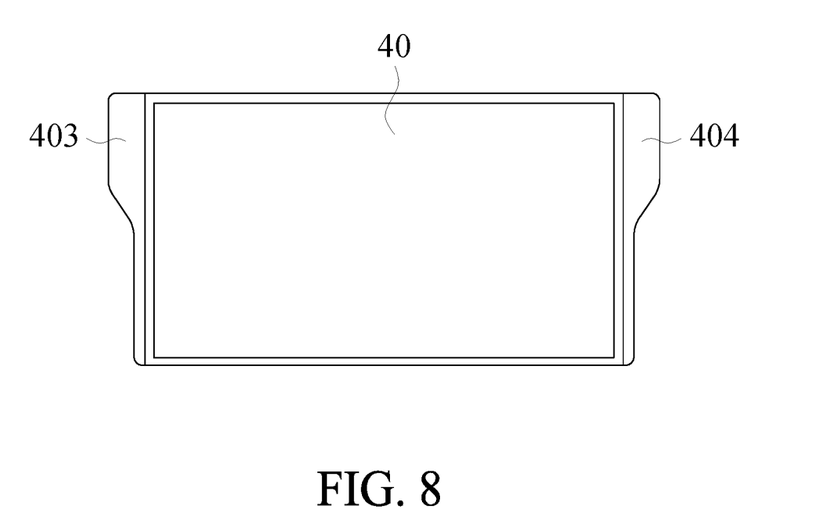
FIG. 8 is a front view of another first screen according to the first preferred embodiment of the present disclosure.

Referring to FIG. 7, in this embodiment, to enhance the distinction of the first screen 40, a first upper decorative panel 401 and a first lower decorative panel 402 are disposed at the top and the bottom of the first screen 40, respectively. A color layer, an identifying pattern layer and a text layer are disposed on the surface of the first upper decorative panel 401 and on the surface of the first lower decorative panel 402. Referring to FIG. 8, in another embodiment, a first left decorative panel 403 and a first right decorative panel 404 are disposed on the left side and right side of the first screen 40, respectively. A color layer, an identifying pattern layer and a text layer are disposed on the surface of the first left decorative panel 403 and the surface of the first right decorative panel 404.

Figure 9:
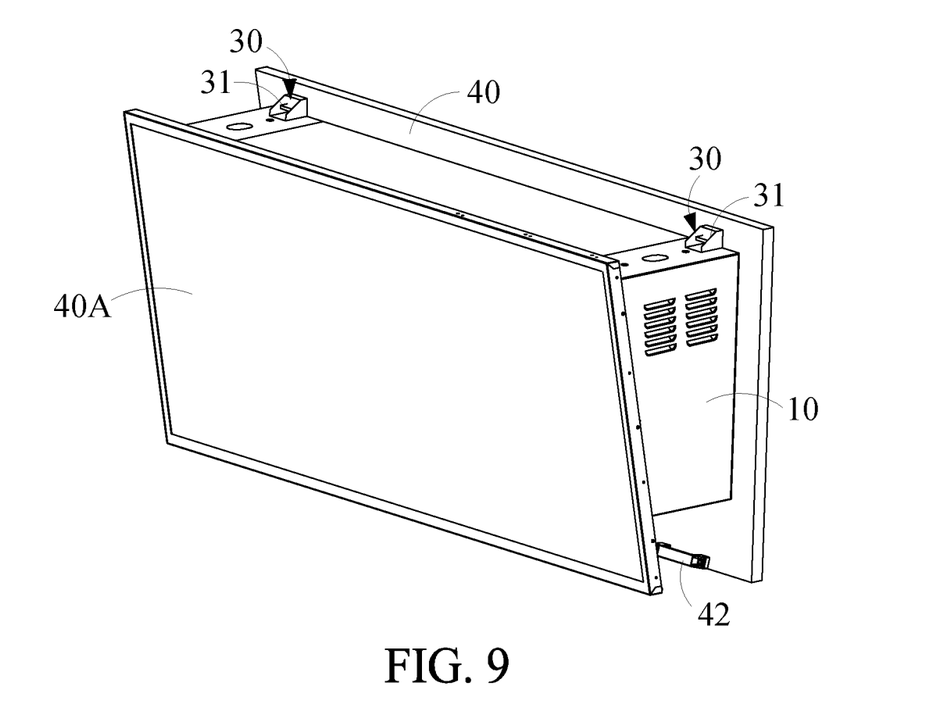
FIG. 9 is a perspective view of the second preferred embodiment of the present disclosure.
Figure 10:
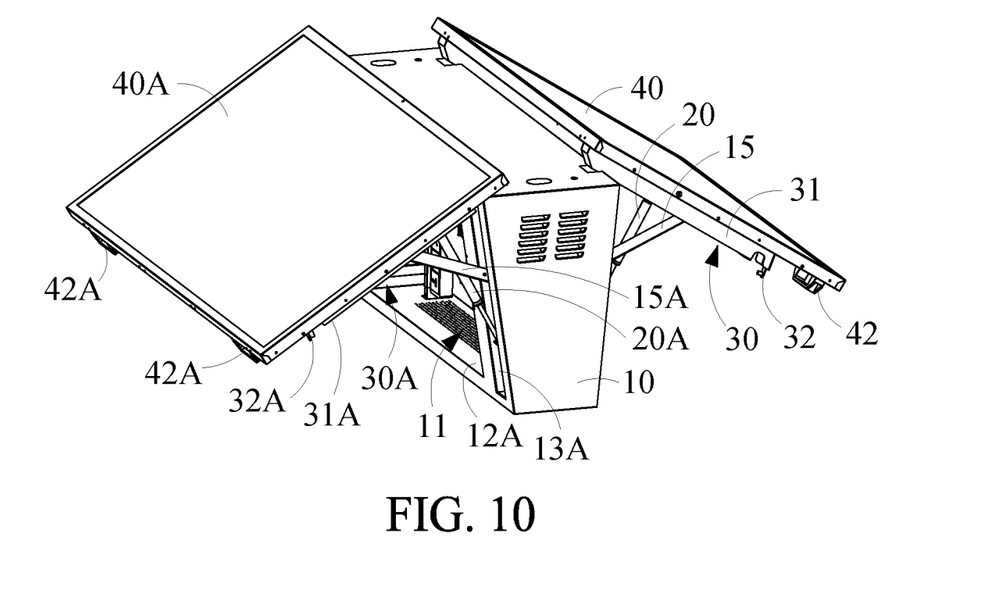
FIG. 10 is another perspective view of the second preferred embodiment of the present disclosure.
Figure 11:
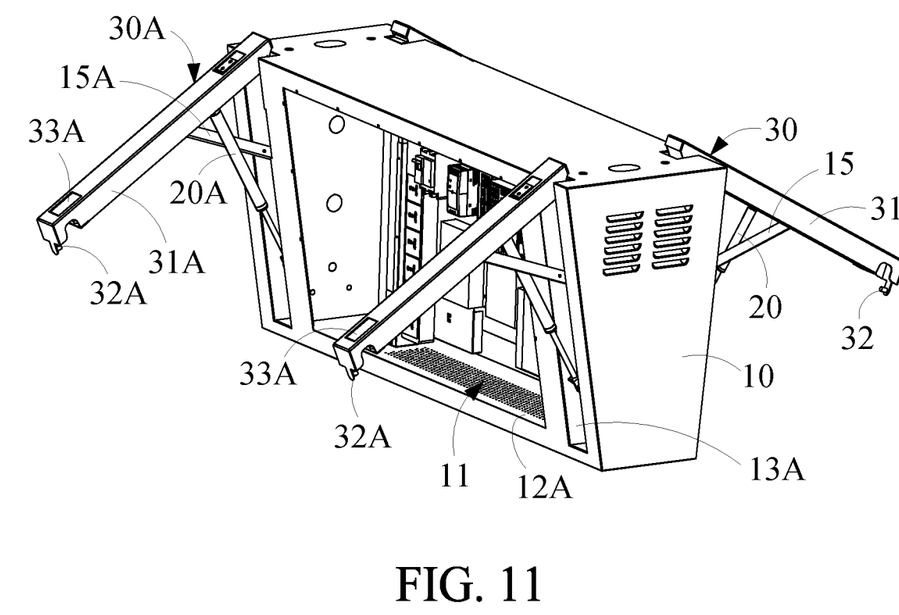
FIG. 11 is yet another perspective view of the second preferred embodiment of the present disclosure.

A housing structure of an information display unit is provided in the second preferred embodiment of the present disclosure. Referring to FIGS. 9, 10, the second preferred embodiment is substantially identical to the first preferred embodiment. However, the housing structure in the second preferred embodiment further comprises two second extensible elements 20A, a second brace 30A, a second window 12A disposed on the back side of the first casing 10 and adapted to be in communication with the first receiving space 11, and two auxiliary fixing elements 15A. Referring to FIG. 1, the second extensible elements 20A and the second brace 30A in the second preferred embodiment are identical to the first extensible elements 20 and the first brace 30 in the first preferred embodiment in terms of structure, except for the distinguishing technical features of the second preferred embodiment as described below. First, the second extensible elements 20A and the second brace 30A are disposed on the back side of the first casing 10. Second, a second screen 40A is disposed on the second brace 30A and electrically connected to the circuit module 41. Third, the second screen 40A has thereon at least one handle portion 42A whereby the housing structure can be lifted both from the front and from the back, and can be fitted to a screen.

In the second preferred embodiment, two second channels 13A, which are identical to the first channels 13, are disposed on the back side of the first casing 10, whereas the second extensible elements 20A and the second brace 30A are received in the second channels 13A. Likewise, the second brace 30A comprises two support elements 31A. The support elements 31A face the front side of the first casing 10 and each have a recess 311A (not shown). The recesses 311A receive the second extensible elements 20A. The top ends of the two auxiliary fixing elements 15A are pivotally disposed in the recesses 311A of the support elements 31A, respectively. The bottom ends of the two auxiliary fixing elements 15A are pivotally disposed in the second channels 13A of the first casing 10, respectively. Likewise, the top ends of the second extensible elements 20A are pivotally disposed in the recesses 311A of the support elements 31A and positioned proximate to the top ends of the support elements 31A, respectively. Likewise, the bottom ends of the second extensible elements 20A are pivotally disposed in the second channels 13A, respectively, and positioned proximate to the bottom of the first casing 10. Likewise, the bottom ends of the support elements 31A each have a first coupling portion 32A adapted to be coupled to the first casing 10. The second extensible elements 20A and the second brace 30A in the second preferred embodiment have the same operating principle as the first extensible elements 20 and the first brace 30 in the first preferred embodiment. Likewise, at least one connecting portion 33A is disposed at each support element 31A of the second brace 30A.

Figure 12:
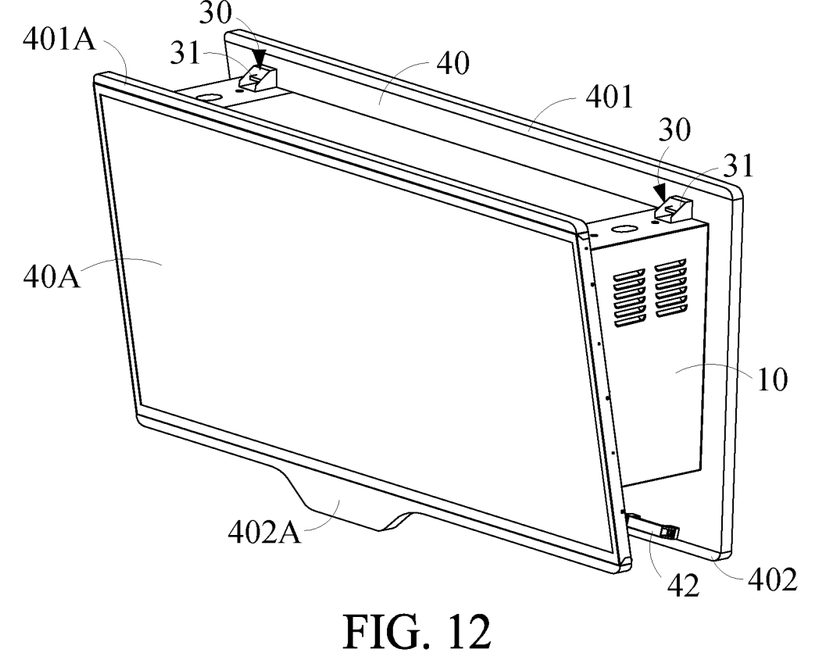
FIG. 12 is a perspective view of decorative panels according to the second preferred embodiment of the present disclosure.

In the first preferred embodiment, to enhance the distinction of the first screen 40, the first upper decorative panel 401 and the first lower decorative panel 402 (shown in FIG. 7) are disposed at the top and the bottom of the first screen 40, respectively, or the first left decorative panel 403 and the first right decorative panel 404 (shown in FIG. 8) are disposed on the left side and the right side of the first screen 40, respectively. As with the embodiment illustrated with FIG. 12, this embodiment is further characterized in that a first upper decorative panel 401A and a first lower decorative panel 402A are disposed at the top and bottom of the second screen 40A, respectively, or a first left decorative panel and a first right decorative panel (not shown) are disposed on the left side and right side of the second screen 40A, respectively.

Figure 13:
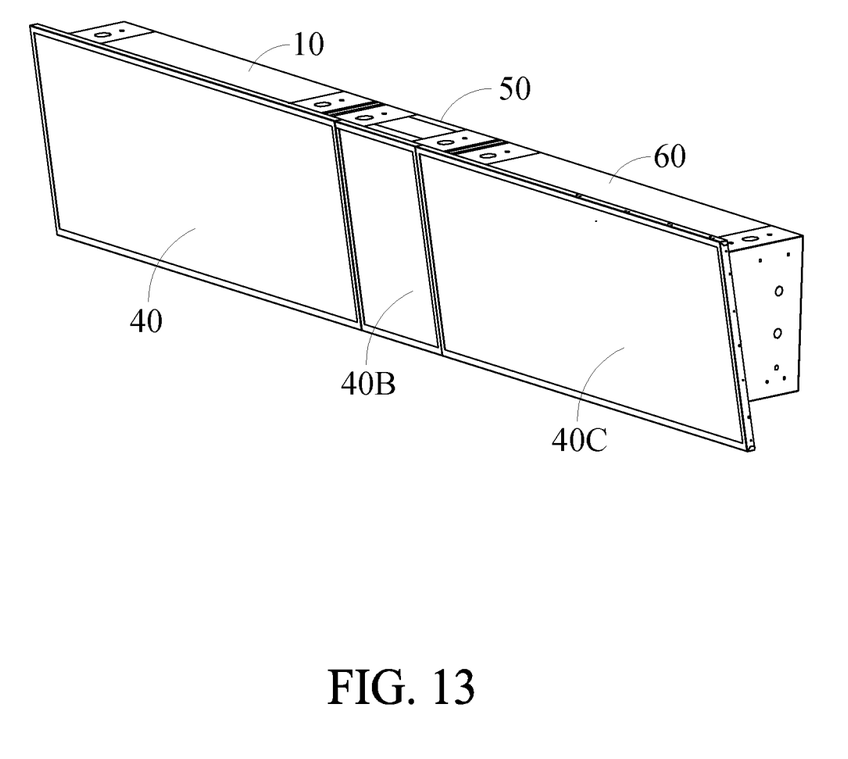
FIG. 13 is a perspective view of the third preferred embodiment of the present disclosure.
Figure 14:
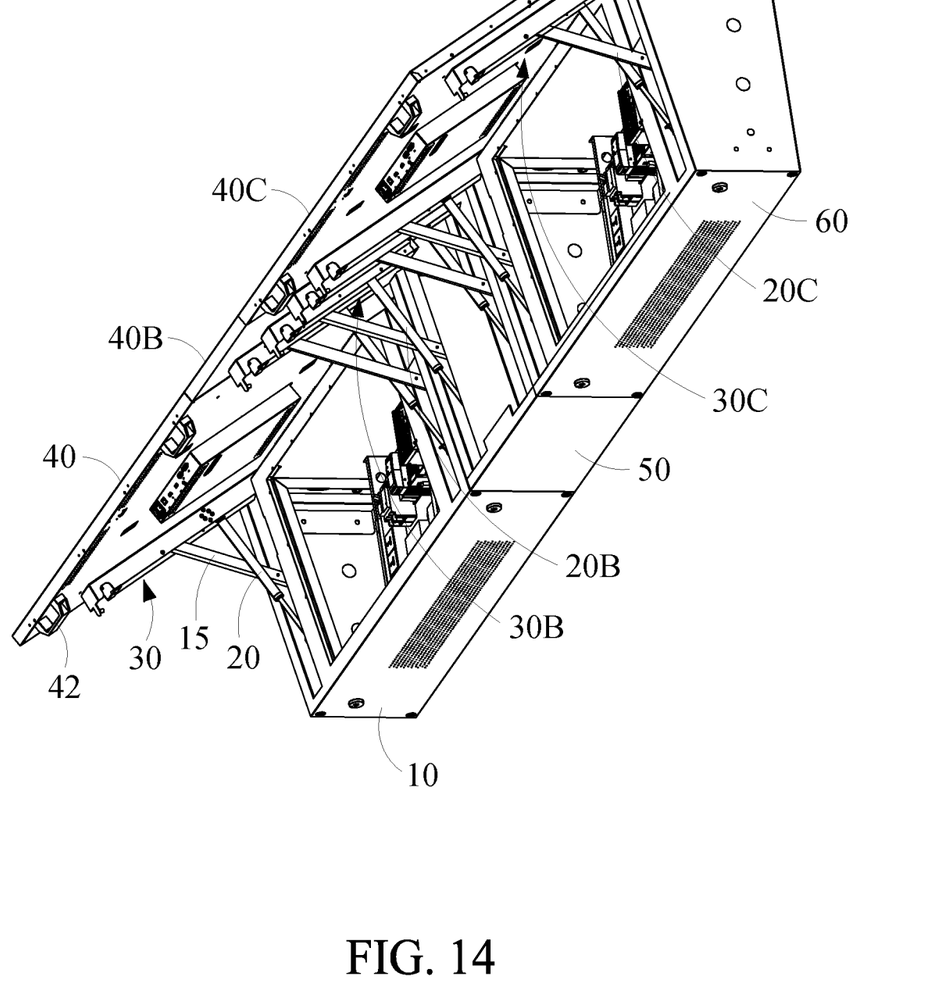
FIG. 14 is another perspective view of the third preferred embodiment of the present disclosure.

The third preferred embodiment of the present disclosure provides a housing structure of an information display unit. Referring to FIG. 13, 14, the third preferred embodiment is substantially identical to the first preferred embodiment except for the distinguishing technical features of the third preferred embodiment as described below. First, the housing structure in the third preferred embodiment further comprises at least one connecting casing 50, two third extensible elements 20B disposed on the connecting casing 50, a third brace 30B, a third screen 40B disposed on the connecting casing 50, at least one second casing 60, two fourth extensible elements 20C disposed on the second casing 60, a fourth brace 30C, and a fourth screen 40C disposed on the second casing 60. The connecting casing 50 is fixedly in contact with the first casing 10; for example, the left side of the connecting casing 50 is fixedly in contact with the right side of the first casing 10, or the right side of the connecting casing 50 is fixedly in contact with the left side of the first casing 10, but the present disclosure is not limited thereto. Referring to FIGS. 13, 14, the left side of the connecting casing 50 is fixedly in contact with the right side of the first casing 10, whereas the left side of the second casing 60 is fixedly in contact with the right side of the connecting casing 50. The connection of the second casing 60 and the connecting casing 50 is adjustable according to the connection of the connecting casing 50 and the first casing 10.

The connecting casing 50, the third extensible elements 20B, the third brace 30B and the fourth screen 40C in the third preferred embodiment are identical to the first casing 10, the first extensible elements 20, the first brace 30 and the first screen 40 in the first preferred embodiment in terms of structures, connection relationships therebetween, and operating principles except that not only is the connecting casing 50 smaller than the first casing 10, but the third screen 40B is also smaller than the first screen 40, because both the connecting casing 50 and the first casing 10 are of an inverted trapezoid shape.

The second casing 60, fourth extensible elements 20C, fourth brace 30C and fourth screen 40C in this preferred embodiment are identical to the first casing 10, first extensible elements 20, first brace 30 and first screen 40 in the first preferred embodiment in terms of structures, connection relationships therebetween, and operating principles.

Figure 15:
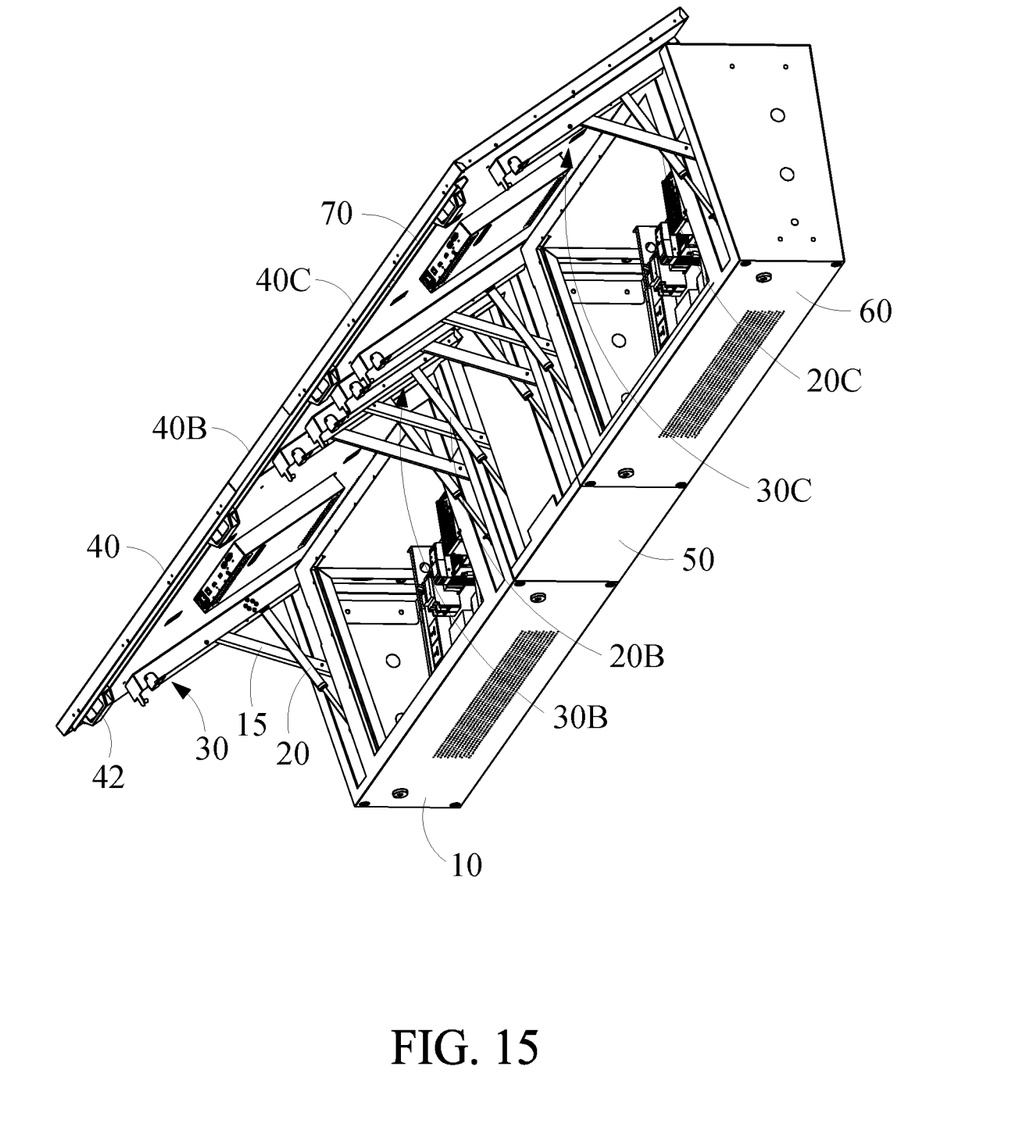
FIG. 15 is a perspective view of a link element according to the third preferred embodiment of the present disclosure.

Referring to FIG. 15, to enable the maintenance technician to open the first screen 40, the third screen 40B and the fourth screen 40C simultaneously, the housing structure in this embodiment further comprises a link element 70. The link element 70 is disposed on the back sides of the first screen 40, the third screen 40B and the fourth screen 40C so as to connect the first screen 40, the third screen 40B and the fourth screen 40C simultaneously.

Figure 16:
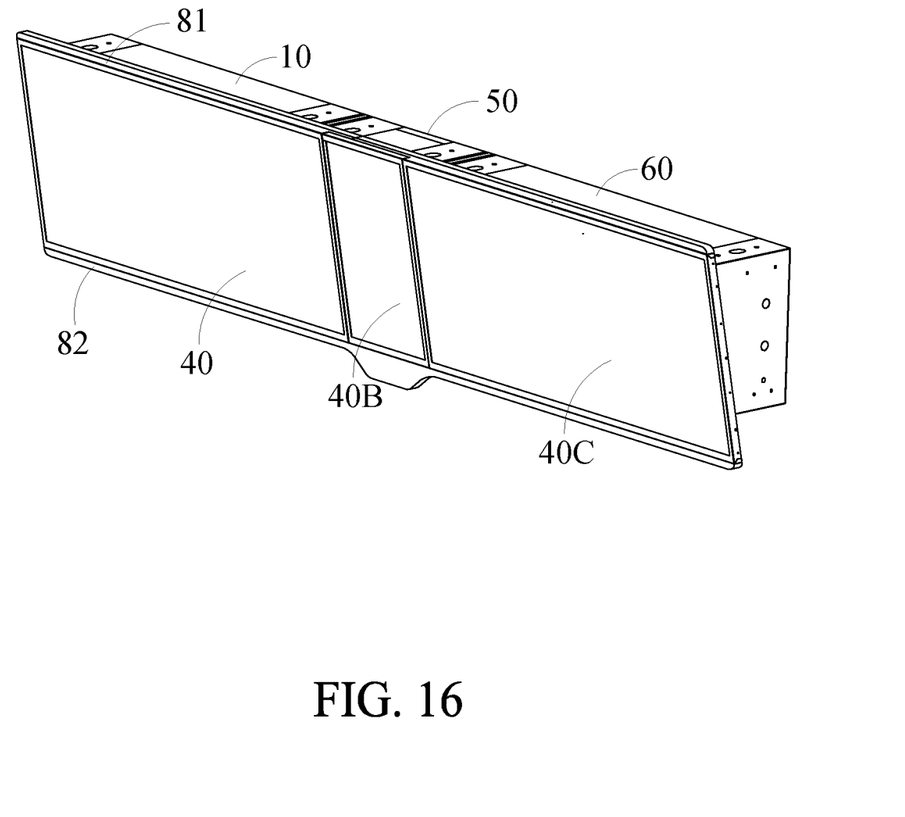
FIG. 16 is a perspective view of decorative panels according to the third preferred embodiment of the present disclosure.

Referring to FIG. 16, to enhance the distinction of the first screen 40, the third screen 40B and the fourth screen 40C simultaneously, the housing structure in this embodiment further comprises a second upper decorative panel 81 and a second lower decorative panel 82. The second upper decorative panel 81 is disposed at the tops of the first screen 40, the third screen 40B and the fourth screen 40C to connect the tops of the first screen 40, the third screen 40B and the fourth screen 40C. The second lower decorative panel 82 is disposed at the bottoms of the first screen 40, the third screen 40B and the fourth screen 40C to connect the bottoms of the first screen 40, the third screen 40B and the fourth screen 40C.

Like the first preferred embodiment, this embodiment further has technical features as follows: a second left decorative panel (not shown) is disposed on the left side of the first screen 40, and a second right decorative panel (not shown) is disposed on the right side of the fourth screen 40C.

In the third preferred embodiment, the connecting casing 50, the second casing 60 and the first casing 10 are series-connected to not only bring about an expansion effect but also render repair convenient.

Therefore, with the first extensible elements 20 being pivotally disposed between the first casing 10 and the first brace 30, the first brace 30 is liftably disposed on the front side of the first casing 10, whereas the first brace 30 can be lifted from the front relative to the first casing 10. The first extensible elements 20 support the first brace 30 and the first screen 40 such that the repair space is formed between the first brace 30, the first screen 40 and the first casing 10. To repair the first screen 40 or the circuit module 41, the maintenance technician exerts a force on the handle portion 42 of the first screen 40 to lift the first screen 40 and the first brace 30 from the front, whereas the first extensible elements 20 extend forward and upward to thereby push and support the first brace 30, and in consequence the repair space which facilitates a repair carried out by the maintenance technician is formed between the first screen 40, the first brace 30 and the first casing 10, allowing the maintenance technician to repair the circuit module 41 or the first screen 40. When the first screen 40 fails, the maintenance technician only needs to demount the first screen 40 from the first brace 30. Therefore, when the first screen 40 fails, the maintenance technician neither needs to demount the housing structure entirely in order to repair the first screen 40 nor needs to discard the housing structure entirely, so as to render the repair convenient and quick but also avoid a waste of material and thus reduce the repair costs.

The first brace 30 enables the first screen 40 to be mounted in place so as to not only allow the maintenance technician to easily change a screen of different sizes as needed but also require the maintenance technician merely to electrically connect the first screen 40 to the circuit module 41 in the first casing 10. Therefore, the present disclosure manifests ease of assembly and enhances the adaptability of choice of screen size.

The first casing 10 has therein the first receiving space 11 and is equipped with the liftable first brace 30. A screen of any size is adaptably mounted on the first brace 30 to attain modularized islanding design, thereby enhancing demand.

What is claimed is:

1. A housing structure of an information display unit, comprising:
    a first casing having therein a first receiving space, wherein a first window is disposed on a front side of the first casing and is in communication with the first receiving space;
    two first extensible elements each having a bottom end pivotally disposed at a bottom of the front side of the first casing; and
    a first brace disposed on the front side of the first casing, wherein a top end of each said first extensible element is pivotally disposed at a top of the first brace such that the first brace is liftably disposed on the front side of the first casing.

2. The housing structure of an information display unit according to claim 1, wherein two first channels are disposed on the front side of the first casing and positioned proximate to left and right sides of the first casing, respectively, and the bottom ends of the first extensible elements are pivotally disposed in the first channels, allowing the first channels to receive the first extensible elements and the first brace.

3. The housing structure of an information display unit according to claim 2, wherein the first brace comprises two support elements, with a recess disposed on a back side of each said support element, the top ends of the first extensible elements are pivotally disposed in the recesses of the support elements, and the recesses of the support elements receive the first extensible elements.

4. The housing structure of an information display unit according to claim 3, wherein a first coupling portion is disposed at a bottom end of each said support element, and a second coupling portion is disposed in each said first channel of the first casing and coupled to a corresponding one of the first coupling portions.

5. The housing structure of an information display unit according to claim 1, wherein the first casing is of an inverted trapezoid shape.

6. The housing structure of an information display unit according to claim 5, further comprising a first screen and a circuit module electrically connected to the first screen, the first screen being disposed on the first brace, the circuit module being received in the first receiving space.

7. The housing structure of an information display unit according to claim 6, wherein a second window is disposed on a back side of the first casing and is in communication with the first receiving space, and the housing structure further comprises:
    two second extensible elements each having a bottom end pivotally disposed at a bottom of the back side of the first casing; and
    a second brace disposed on the back side of the first casing such that the top ends of the second extensible elements are pivotally disposed at the top of the second brace to allow the second brace to be liftably disposed on the back side of the first casing.

8. The housing structure of an information display unit according to claim 7, further comprising a second screen disposed on the second brace and electrically connected to the circuit module in the first casing.

9. The housing structure of an information display unit according to claim 6, further comprising:
    a connecting casing having therein a receiving space and being in contact with the first casing, wherein a window is disposed on a front side of the connecting casing and is in communication with the receiving space;
    two third extensible elements each having a bottom end pivotally disposed at a bottom of the front side of the connecting casing;
    a third brace disposed on the front side of the connecting casing such that the top ends of the third extensible elements are pivotally disposed at the top of the third brace to allow the third brace to be liftably disposed on the front side of the connecting casing;
    a second casing having therein a receiving space and disposed on another side of the connecting casing, wherein a window is disposed on a front side of the second casing and is in communication with the receiving space of the second casing;
    two fourth extensible elements each having a bottom end pivotally disposed at a bottom of the front side of the second casing; and
    a fourth brace disposed on the front side of the second casing such that the top ends of the fourth extensible elements are pivotally disposed at the top of the fourth brace to allow the fourth brace to be liftably disposed on the front side of the second casing.

10. The housing structure of an information display unit according to claim 9, further comprising:
    a third screen disposed on the third brace;
    a circuit module corresponding in position to the third screen, disposed in the receiving space of the connecting casing, and electrically connected to the third screen;
    a fourth screen disposed on the fourth brace; and
    a circuit module corresponding in position to the fourth screen, disposed in the receiving space of the second casing, and electrically connected to the fourth screen.

* * * * *